(12) United States Patent
Kuwabara

(10) Patent No.: US 6,989,060 B2
(45) Date of Patent: Jan. 24, 2006

(54) CALCIUM FLUORIDE CRYSTAL AND METHOD AND APPARATUS FOR USING THE SAME

(75) Inventor: Tetsuo Kuwabara, Ibaraki-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 138 days.

(21) Appl. No.: 10/086,074

(22) Filed: Feb. 26, 2002

(65) Prior Publication Data

US 2002/0162501 A1 Nov. 7, 2002

(30) Foreign Application Priority Data

Feb. 26, 2001 (JP) ............................. 2001-051027

(51) Int. Cl.
*C30B 11/00* (2006.01)
*C30B 29/12* (2006.01)

(52) U.S. Cl. ...................... 117/940; 117/937; 423/489; 423/490

(58) Field of Classification Search .............. 423/489, 423/490; 117/3, 940, 2, 937
See application file for complete search history.

(56) References Cited

U.S. PATENT DOCUMENTS

| 6,123,764 | A  | * | 9/2000  | Mizugaki et al. | ............. | 117/68  |
| 6,238,479 | B1 | * | 5/2001  | Oba             | ............. | 117/68  |
| 6,270,570 | B2 | * | 8/2001  | Ohba et al.     | ............. | 117/76  |
| 6,342,312 | B2 | * | 1/2002  | Oba et al.      | ............. | 428/696 |
| 6,377,332 | B1 | * | 4/2002  | Sakuma et al.   | ............. | 355/53  |
| 6,630,117 | B2 | * | 10/2003 | Sparrow         | ............. | 423/490 |
| 2001/0025598 | A1 | * | 10/2001 | Staeblein et al. | ............. | 117/81  |
| 2003/0158028 | A1 | * | 8/2003  | Loiacono et al. | ............. | 510/40  |

FOREIGN PATENT DOCUMENTS

| EP | 0 869 203 A2 | 10/1998 |
| EP | 0 875 778 A1 | 11/1998 |
| EP | 0 919 646 A1 | 6/1999  |
| EP | 0 995 820 A1 | 4/2000  |

OTHER PUBLICATIONS

Mouchovski, et al., *Growth of Ultra-Violet Grade CaF$_2$ Crystals and their Application for Excimer Laser Optics*, Apr. 1, 1996, XP000627179.
Patent Abstracts of Japan, Publication No. 09 315815, Publication date Dec. 9, 1997.
Patent Abstracts of Japan, Publication No. 10 279378, Publication date Oct. 20, 1998.
Patent Abstracts of Japan, Publication No. 2001-019586, Publication date Jan. 23, 2001.
European Search Report, Jun. 7, 2002.

* cited by examiner

*Primary Examiner*—N. M. Nguyen
(74) *Attorney, Agent, or Firm*—Morgan&Finnegan, LLP

(57) ABSTRACT

A calcium fluoride crystal produced in accordance with a method for producing calcium fluoride crystal on the basis of refining a raw material of calcium fluoride and causing crystal growth of the refined calcium fluoride, the method including a process of raising a purity of the calcium fluoride to complement the refining, wherein a transition density in crystal is not greater than $1\times10^5/cm^2$, and that dispersion of transition density inside an effective portion in crystal is in a range of $\pm5\times10^4/cm^2$. Also disclosed is an optical element to be manufactured by use of such CaF2 crystal.

6 Claims, 8 Drawing Sheets

CALCIUM FLUORIDE CRYSTAL AND METHOD AND APPARATUS FOR USING THE SAME

FIELD OF THE INVENTION AND RELATED ART

This invention relates generally to a crystal producing method and, more particularly, to a method and apparatus for producing calcium fluroride (CaF2) which may be a material for an optical element to be used in a lithographic exposure apparatus, for example.

Because of recent demands of reduction in size and thickness of electronic instruments, further miniaturization of semiconductor devices to be incorporated into electronic instruments have been required more and more. As regards the design rule for a mask pattern, for example, mass-production of a line-and-space (L&S) 130 nm will be accomplished and, to this end, it will be smaller and smaller. The line-and-space (L&S) is an image projected on a wafer, in such state that the widths of the line and the space are the same, and it is the scale of exposure resolution. In the exposure process, three parameters of resolution, overlay precision and throughput are important. The resolution concerns a minimum size to be accurately transferred, and the overlay precision is the precision for superposing patterns upon a workpiece. The throughput is the number of workpieces to be processed per unit time.

Shortening the wavelength of an exposure light source is effective to improve the resolution. For this reason, recently, exposure light sources have been changed from KrF excimer lasers (wavelength is about 248 nm) to ArF excimer lasers (wavelength is about 193 nm). Further, practical use of F2 excimer lasers (wavelength is about 157 nm) has been advanced. Among various glass materials, CaF2 crystal has a high transmissivity (i.e., internal transmissivity) to light of such wavelength region, and it is the best optical material for an optical element such as lens or diffraction grating to be used in an exposure optical system.

Parameters for evaluating the optical characteristics of an optical material for a lens (or the like) include (1) internal transmissivity, (2) laser durability, which represents changes in transmissivity where laser light is continuously received, (3) refractive index uniformity (homogeneity), which represents that the refractive index of a lens is constant with location, (4) birefringence index, (5) processing (or polishing) precision, and the like.

CaF2 crystal having one or more good optical characteristics as described above as well as a method of producing such crystal, are disclosed in Japanese Laid-Open Patent Application, Laid-Open No. 315815/1997 or Japanese Laid-Open Patent Application, Laid-Open No. 279378/1998.

SUMMARY OF THE INVENTION

However, while CaF2 crystals produced by conventional methods show good optical characteristic with respect to visible light, the laser durability to short-wavelength and large-power light such as excimer lasers, for example, is low. The refractive index homogeneity and birefringence index are large, and the surface precision during polishing is not easy to attain. Thus, optical characteristics are not satisfactory. According to investigations made by the inventors of the subject application, it has been found that these inconveniences result from crystal (or lattice) defects of a CaF2 crystal or impurities contained therein.

It is accordingly an object of the present invention to provide a unique and useful calcium fluoride crystal by which at least one of the above-described inconveniences can be solved, as well as to provide at least one of a method and apparatus for producing such calcium fluoride crystal, an optical element using such calcium fluoride crystal, an exposure apparatus having an optical system using such optical element, a device manufacturing method using such exposure apparatus, and a device manufactured by use of such exposure apparatus.

More specifically, it is an object of the present invention to provide a calcium fluoride crystal and a method and apparatus for producing the same, having good optical characteristics such as laser durability, for example.

It is another object of the present invention to provide an optical element using such calcium fluoride crystal and an exposure apparatus (particularly, for photolithography using an excimer laser as an exposure light source) having such optical element used in an optical system.

It is a further object of the present invention to provide a device manufacturing method using such exposure apparatus, and a quality device (such as semiconductor, LCD, CCD, thin film magnetic head, or the like) produced by using such exposure apparatus.

In accordance with an aspect of the present invention, to achieve these objects, there is provided a calcium fluoride crystal, characterized in that the calcium fluoride crystal is produced in accordance with a method for producing calcium fluoride crystal on the basis of refining a raw material of calcium fluoride and causing crystal growth of the refined calcium fluoride, the method including a process for raising a purity of the calcium fluoride to complement the refining, that a transition density in crystal is not greater than $1 \times 10^5/$cm$^2$, and that dispersion of transition density inside an effective portion in crystal is in a range of $\pm 5 \times 10^4$/cm$^2$.

The purity raising step may include: a process for removing moisture contained in the calcium fluoride crystal as an impurity; a process for removing other adsorbed matters such as organic contaminants inherently contained in the atmosphere, for example; temperature control during the refining or growth such as, for example, for setting optimum temperature gradient about solid-liquid interface to promote segregation; or process condition control for slowing down the crystal growth speed or prolonging the vacuum application time, for example.

In accordance with another aspect of the present invention, there is provided an optical element which is produced from such CaF2 crystal. Such calcium fluoride crystal has a small transition density, and also the dispersion of transition density is small. Thus, there are relatively few crystal defects, and the invention provides an optical element having good optical characteristics including refractive index homogeneity, birefringence index, internal transmissivity and laser durability. The optical element may be one of a lens, a diffraction grating, an optical film and a composite of them, that is, for example, a lens, a multiple lens, a lens array, a lenticular lens, a fly's eye lens, an aspherical lens, a diffraction grating, a binary optics element, and a composite of them. In addition to a single element of lens or the like, the optical element may be a photosensor for focus control, for example.

In accordance with a further aspect of the present invention, there is provided a method of producing calcium fluoride, comprising the steps of: refining a raw material of calcium fluoride; causing crystal growth of the refined calcium fluoride; and removing, prior to said crystal growth step and in addition to said refining step, moisture contained in the calcium fluoride.

In this method, since impurities are removed by the moisture removing step, the amount of scavenger to be added can be small. Thus, the amount of residual scavenger contained in the crystal becomes smaller, such that impurities or crystal defects are reduced.

Preferably, the method further comprises a step of adding, prior to said refining step, a scavenger of not less than 0.001 mol % and not greater than 0.1 mol % to the raw material of calcium fluoride.

More preferably, the amount of scavenger addition may be 0.02 mol %.

If the amount of scavenger addition is large, the residual scavenger component causes a decrease of refractive index homogeneity and deteriorations of internal transmissivity and laser durability. Since the quantities defined above causes smaller residue of scavenger, impurities contained in the CaF2 crystal and crystal defect (particularly, transition defect) are reduced, such that the provision of quality CaF2 crystal is enabled.

The moisture removing step may comprise heating the raw material of calcium fluoride in a vacuum ambience or a reduced pressure ambience. Such process accelerates the moisture removal, if a vacuum ambience or a reduced pressure ambience and heating (baking) are combined.

The heating process may comprise heating a container (e.g., crucible) for accommodating the raw material of calcium fluoride therein, to thereby heat the raw material of calcium fluoride. This is preferable in that unloading the raw material from the container is unnecessary.

The moisture removing step may be carried out in a gas-flow ambience in which a gas (e.g., nitrogen or argon) for promoting removal of moisture is flown. The gas flow is effective to promote moisture removal.

In accordance with a yet further aspect of the present invention, there is provided an apparatus for producing calcium fluoride crystal, comprising: a first processing unit for refining a raw material of calcium fluoride; a second processing unit for causing crystal growth of the calcium fluoride; and a third processing unit, separate from said first and second units, for removing moisture contained in the calcium fluoride.

Although the first and second processing units for refining and crystal growth may be generally expensive, a separate third unit being relatively inexpensive is used to improve the throughput and economy as the whole production system.

The third processing unit may include a processing chamber for accommodating the raw material of calcium fluoride therein, an exhaust unit for maintaining a reduced pressure ambience or a vacuum ambience inside said processing chamber, and a heating unit for heating the raw material of calcium fluoride.

The processing chamber may have a container housed therein, for accommodating the raw material of calcium fluoride therein, wherein said heating unit may heat the raw material of calcium fluoride together with said container.

Such structure is preferable in that unloading the raw material from the container is unnecessary.

In accordance with a still further aspect of the present invention, there is provided an exposure apparatus, characterized in that ultraviolet light, deep ultraviolet light and/or vacuum ultraviolet light is used as exposure light, and that a workpiece is exposed by irradiating the same with the exposure light through an optical system including an optical element as recited above.

Such exposure apparatus has similar features as the optical element described above.

In accordance with s still further aspect of the present invention, there is provided a device manufacturing method, comprising the steps of: exposing a workpiece by use of an exposure apparatus as recited above; and performing a predetermined process to the exposed workpiece.

The scope of the present invention related to the device manufacturing method described above extends, like that of the exposure apparatus, to a device itself which may be an intermediate product or a final product. The device may be a semiconductor chip such as LSI or VLSI, or it may be CCD, LCD, magnetic sensor or a thin film magnetic head, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The inventor has made experiments of producing many CaF2 crystals, while changing production conditions in the CaF2 crystal production, and performed measurement of optical characteristics (such as refractive index homogeneity, birefringence index, spectral transmissivity, laser durability, and gamma radiation durability) as well as crystal defect (transition density) and impurity analyses.

In regard to the laser durability, deterioration of transmissivity in respect to ArF laser (output of 30 mJ/cm$^2$ and irradiation with $1 \times 10^4$ pulses) and F2 laser (output of 3 mJ/cm$^2$ and irradiation with $1 \times 10^6$ pulses), was measured. The gamma radiation durability can be inspected easily and inexpensively as compared with laser durability and, additionally, it is possible to detect occurrence of color center with respect to a larger crystal as a whole. As regards irradiation condition, gamma radiation of radiation dose rate $1 \times 10^6$R/H was projected for 1 hour, and a total dose $1 \times 10^6$R was taken. On the basis of evaluations for them, the inventor has found that crystals having good laser or gamma radiation durability and good internal transmissivity have less impurity and less crystal defect.

Further, the inventor has found that crystals having good crystal refractive index homogeneity and good birefringence index have, like evaluation of laser durability, less impurities and less crystal defect (particularly, magnitude of transition density and dispersion of transition density with location within the crystal). Thus, in order to improve the optical characteristics, the content of particular elements that may result in impurities must be suppressed to a level lower than a predetermined. These elements are oxygen, carbon, rare earth, and yttrium (Y). It has also been found that, among them, for reducing the transition density and dispersion thereof, the moisture contained in CaF2 before growth (to be described later) as well as a scavenger for removing the moisture should be decreased. For example, zinc fluoride (ZnF2) scavenger is effective to reduce calcium oxide (CaO) produced due to the presence of moisture and in relation to CaF2, in accordance with formula 1 below, into CaF2 in accordance with formula 2 below.

   CaF2+H2O→CaO+2HF   (Formula 1)

   CaO+ZnF2→CaF2+ZnO↑   (Formula 2)

As described, moisture creates oxides, and the content is larger than carbon, rare earth and Y. The more moisture there is, the more scavenger is required Further, residual scavenger component not consumed becomes impurities to CaF2 crystal. For these reasons, the amount of moisture and scavenger should preferably be decreased.

Figure 1:
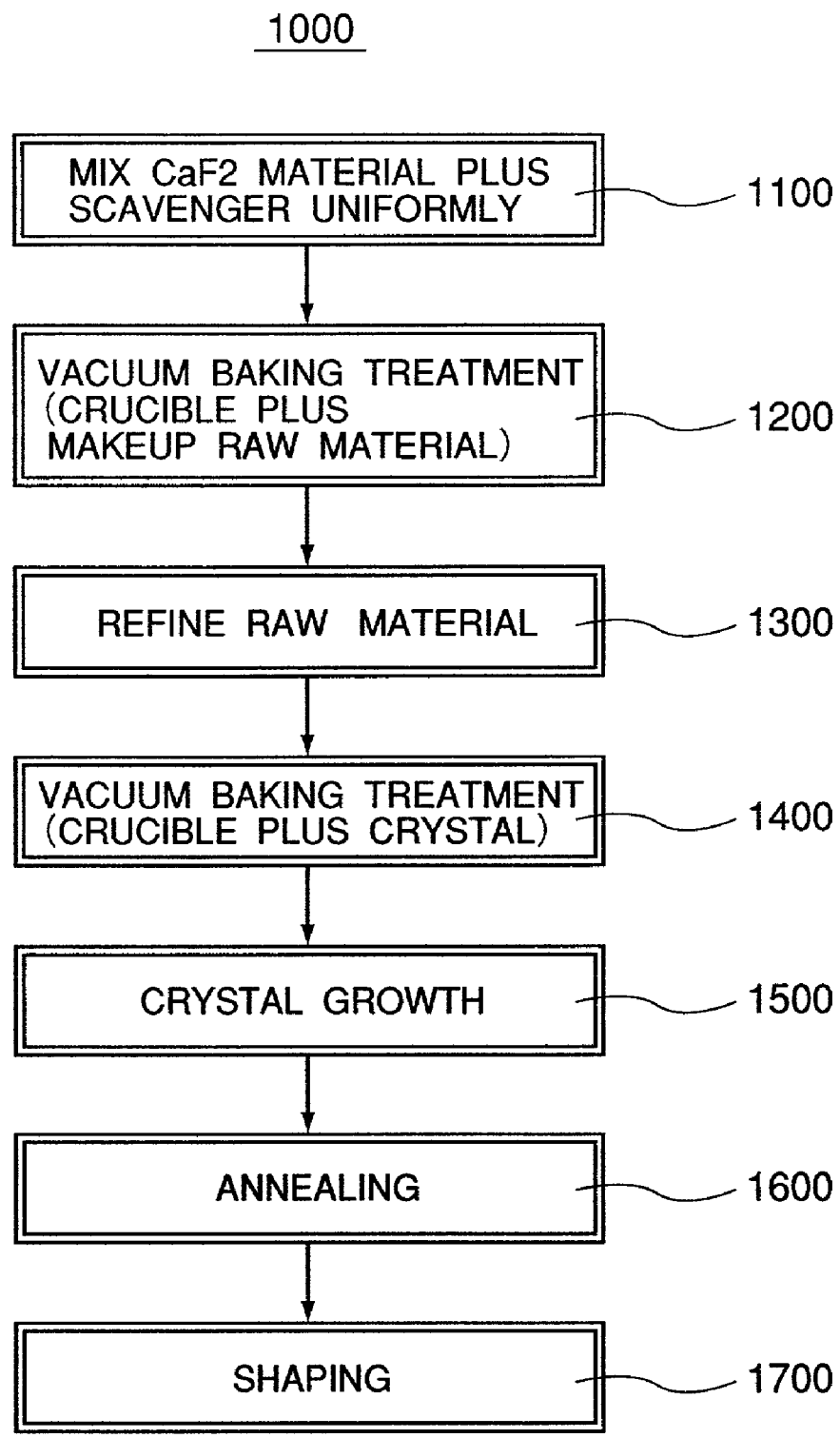
FIG. 1 is a flow chart for explaining a CaF2 crystal producing method according to an embodiment of the present invention.

Next, an embodiment of a producing method (1000) for producing CaF2 crystal and an optical element of the present invention, based on a crucible descending method, will be described. However, the invention is not limited to use of crucible descending method. FIG. 1 shows a flow chart of an embodiment of the present invention, for producing an optical element using CaF2.

Initially, as a raw material, a high-purity synthetic raw material of CaF2 is prepared, and the CaF2 material and a scavenger are mixed (step 1100). Such high-purity CaF2 synthetic raw material may be produced by processing calcium carbonate with fluoric acid. Although the present invention does not exclude a method of removing impurities (e.g., SiO2) by processing CaF2 ore with fluoric acid, the high-purity CaF2 is powder as compared with the ore, and the bulk density thereof is preferably very small (about 10–20μ). It should be noted that, when the CaF2 raw material and the scavenger are mixed, it is preferable that the CaF2 raw material and the scavenger are put into a mixing container and that the container is rotated to assure uniform mixing.

As regards the scavenger, it may desirably be zinc fluoride, cadmium fluoride, manganese fluoride, bismuth fluoride, sodium fluoride, lithium fluoride and the like, which can be easily bonded as compared with fluoride to be grown and which can be easily decomposed and evaporated. Those matters which can easily react with oxides mixed in the fluoride raw material and can be easily evaporated thereby, are chosen. Particularly, zinc fluoride is desirable. Here, it is important to control the amount of scavenger addition.

In this embodiment, the amount of addition of scavenger is not less than 0.001 mol % and not greater than 0.1 mol %, more preferably, 0.02 mol %. If the amount of addition is large, it causes a decrease of refractive index homogeneity due to residual scavenger as well as deterioration of internal transmissivity and laser durability. In other words, the amount of addition mentioned above leads to less residual scavenger and thus to less impurity and crystal defect (particularly, transition density) in CaF2 crystal, such that it can provide high quality CaF2 crystal. The amount of scavenger addition can be decreased as mentioned above, by means of vacuum baking process (steps 1200 and 1400) to be described below.

As one feature of the present invention, before a crystal growing process (step 1500), to be described later, a vacuum baking process (steps 1200 and 1400) is provided. It should be noted here that the effect of purity raising through the vacuum baking may be attainable similarly by the structure of a crystal growing furnace 200 to be described later (for example, to optimize the temperature gradient about the solid-liquid interface where a crucible is pulled down, such that segregation of impurities is collected at the top portion), temperature control, and process condition control (for example, the crystal growing speed is slowed down or the vacuum application time is prolonged), for example.

The mixture of CaF2 powder and scavenger thus obtained is then subjected to vacuum baking process (step 1200). The vacuum baking process is carried out to remove moisture in the mixture or any other absorbed matters therein, by heating the mixture. The vacuum baking process at step 1200 is performed before a refining process (step 1300), to be described later, and as a separate process from the refining step. Here, the other absorbed matters may include organic contaminants inherently contained in the atmosphere, mainly, mist (oil) and the like. A vacuum baking process is performed also at step 1400, but the process at step 1200 absorbs a larger amount of moisture as compared with the process at step 1400, and thus the effect of moisture removal is larger.

Figure 5:
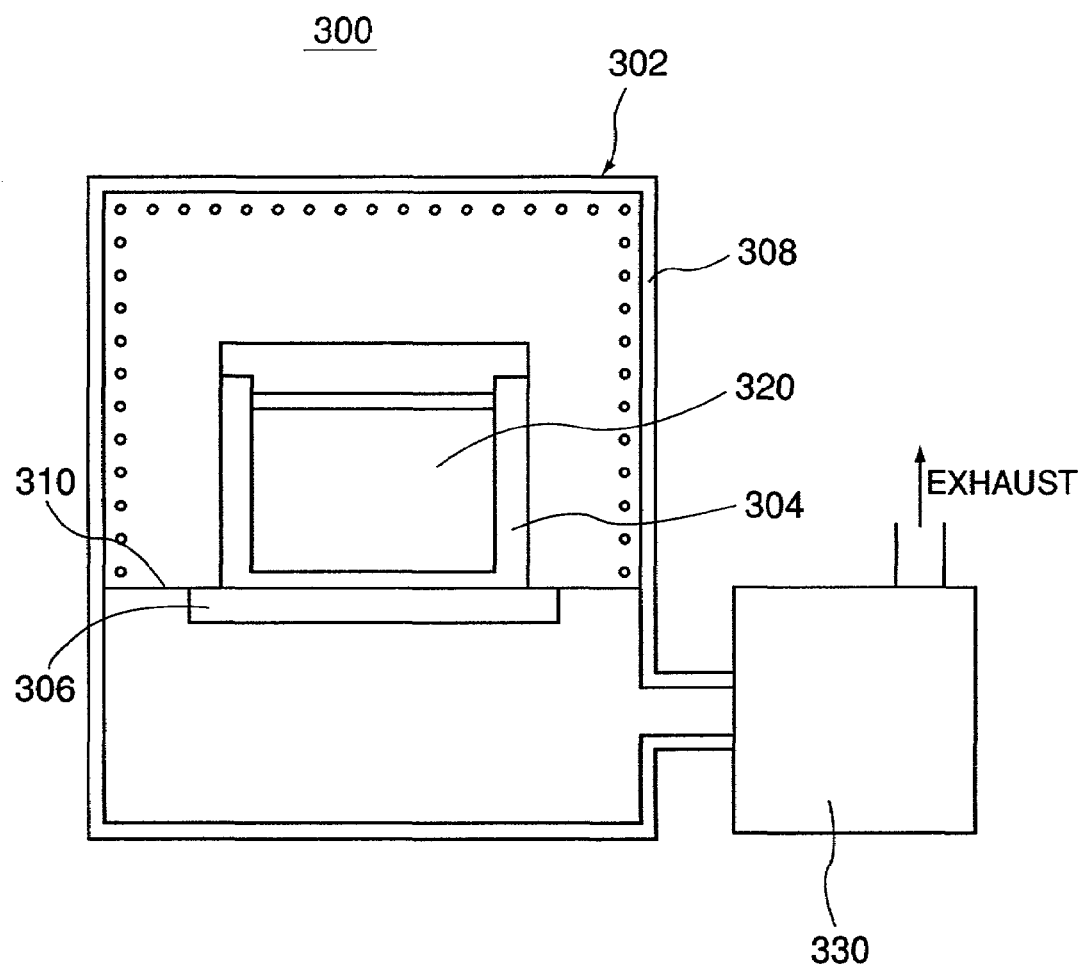
FIG. 5 is a schematic and sectional view of a vacuum baking furnace to be used in a vacuum baking process in the manufacturing method shown in FIG. 1.

In the vacuum baking process, initially, the mixture 320 is put into a crucible 304 made from a porous carbon material, and it is loaded on a mesh table 310 in a vacuum chamber 302 of a vacuum baking furnace 300 shown in FIG. 5. FIG. 5 is schematic and sectional view of the vacuum baking furnace 300. Thus, in this embodiment, the mixture 320 of CaF2 raw material and scavenger is heated together with the crucible 304. In place of using the vacuum baking furnace 300, the mixture 320 may be heated by using a refining furnace 100 which is used in the refining process (step 1300) to be described later. Namely, in the latter case, the refining furnace 100 shown in FIG. 2 functions in the refining process and also in the vacuum baking process. Generally, however, the refining furnace 100 is much expensive than an all-purpose vacuum baking chamber 100 and, additionally, from the standpoint of keeping the time for the refining process through the refining furnace 100, using separate furnaces as in this embodiment will be preferable.

In the vacuum baking furnace 300, the inside space of the vacuum chamber 302 is defined by the mesh table 310 and the heat insulating material 308. It is heat insulated by the insulating material 308, and a vacuum ambience or a reduced pressure ambience is kept therein through a dry pump 330. The mesh table 320 can be heated by a heater 306. Within the inside space of the vacuum chamber 302, a nozzle connected to a gas supplying mechanism (not shown) may be provided to supply into the chamber an inert or inactive gas such as nitrogen, helium, argon, neon, krypton, xenon, for example, for promoting moisture removal, such that a gas flow environment may be provided therein. This is to assure that the number of gas molecules is increased in a reduced pressure ambience, to thereby accelerate removal of moisture molecules and other absorbed contaminants. In the vacuum baking chamber 300, the dry pump 330 evacuates the chamber 302 to a vacuum level of about 10 Pa, and the heater 306 heats it to about 150–200° C. to remove the moisture and inactive gas.

After the vacuum baking process is completed, a refining process is performed to the mixture (step 1300). The refining process is a process for removing impurities such as carbonic acid, for example, to thereby raise the purity of CaF2. It may include dehydration, removal of absorbed contaminants, scavenge reaction, removal of scavenger product, removal of residual scavenger, fusing, and solidification. In the refining process, the mixture 120 in put into a crucible 104 placed in the refining furnace 100 shown in FIG. 2.

Figure 2:
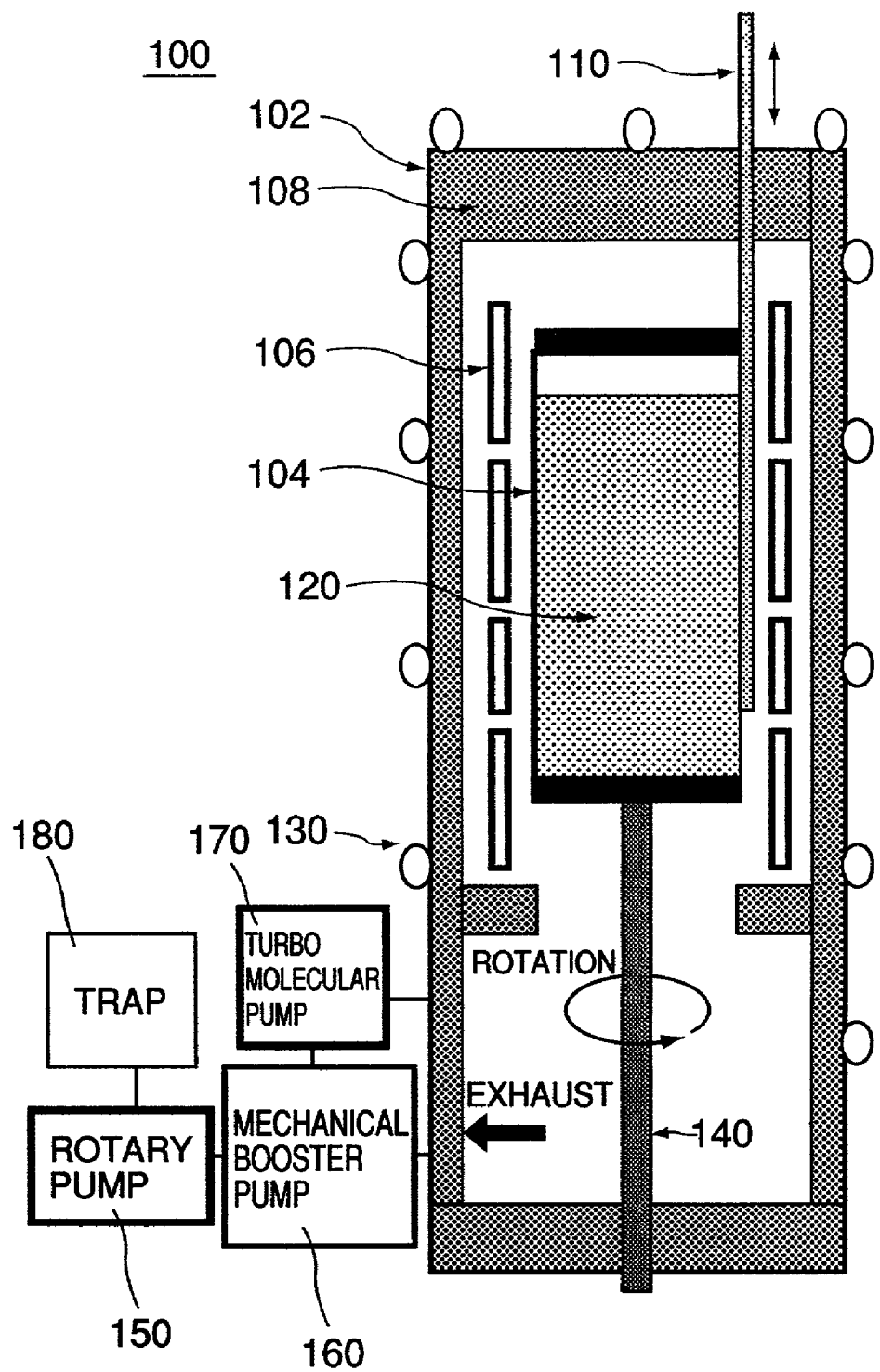
FIG. 2 is a schematic and sectional view of a refining apparatus to be used in a refining process in the manufacturing method shown in FIG. 1.

In FIG. 2, denoted at 102 is a chamber for the refining furnace 100. It is connected to a vacuum exhaust system which comprises a rotary pump 150, a mechanical booster pump 160, a turbo molecular pump 170, and a toxic substance arresting (trap) system 180. Exhaust pumps at 150–170 are not limited to these types of pumps. The arresting (trap) system 180 may comprise a cooling trap for cooling an exhaust gas to separate and remove toxic substances in the exhaust gas or a high-temperature trap for thermally decomposing the exhaust gas, for example.

The chamber 120 is thermally insulated by a heat insulating material 108, and it accommodates a crucible 104 and a heater 106 therein. For example, the crucible 104 is made of carbon and has an approximately cylindrical shape. It is rotatably supported by a crucible supporting and pull-down mechanism 140. The crucible supporting and pull-down mechanism 140 is arranged so that the crucible 104 is descended as required. Rotation by the crucible supporting and pull-down mechanism 140 is carried out so as to make the crucible 104 temperature uniform. In this embodiment, one and the same crucible is used as the crucible 104 and the crucible 304 inside the vacuum baking furnace shown in FIG. 5. However, separate crucibles may be used (that is, the mixture inside the crucible 304 is transferred into the crucible 104). The chamber 102 is connected also to a cooling pipe 130 for temperature adjustment. Thus, by means of the heater 106 and the cooling pipe 130, the temperature inside the chamber 102 can be controlled. Thermocouple 110 is made from platinum, for example, and it functions to measure the temperature of the crucible 104, from about the outside wall of the crucible 104.

Subsequently, the heater 106 is energized to heat the mixture 120 inside the crucible 104, whereby removal of moisture and other absorbed matters is performed. As described, while dehydration is carried out also during the refining process at step 1300, the vacuum baking process at steps 1200 and 1400 is a process separate from the refining process. The refining furnace 100 is vacuum evacuated by means of the vacuum exhaust system, and a vacuum level not less than $1 \times 10^{-3}$ Pa is established therein.

Subsequently, through a temperature change from 350° C. to 1100° C. which is a temperature region for the scavenge reaction, the CaF2 raw material is completely fused.

After the fusing, in order to remove any residual toxic elements, the material in fused state is held for a few hours to several ten of hours.

Subsequently, the crucible 104 is descended to gradually cool the fused CaF2 material to cause crystal growth. Since there is no necessity of putting the lattice disposition of CaF2 crystal in order, the descending speed of the crucible should not always be slow. Although the present invention includes a case wherein the crucible 104 is not descended, by descending the crucible 104, the effect of impurity removal is enhanced. This process does not need precise temperature control as being made in the monocrystal growing process (step 1500), to be described later. Therefore, the crystal obtained by this process may be one including a particle phase. Of the crystal thus obtained, particularly a top portion, that is, the portion having been crystallized last with respect to time, is removed. Since many impurities are collected in this portion (that is, segregation occurs there), by removing it, impurities that may adversely affect the characteristic can be removed effectively. After that, the crystal is put into the crucible 104 again, and then, sequential operations of fusing, crystallization, and removing the top portion, is repeated plural times. If necessary, an inert or inactive gas may be introduced into the chamber 102.

Subsequently, a vacuum baking process is carried out to the refined CaF2 crystal (step 1400). The vacuum baking process is performed to heat the mixture, thereby to remove any moisture still remaining in the CaF2 crystal. The vacuum baking process at step 1400 is carried out after the refining process at step 1300, and as a separate process from the refining process. In this embodiment, the vacuum baking furnace 300 shown in FIG. 5 is used to remove moisture as has been described with reference to FIG. 5. Alternatively, the refining furnace 100 or a crystal growing furnace 200 to be described later may be used. Generally, however, the refining furnace 100 and the crystal growing furnace 200 are much more expensive than an all-purpose vacuum baking chamber 300 and, additionally, from the standpoint of keeping the time for the refining process through the refining furnace 100 and the crystal growth through the crystal growing furnace 200, using separate furnaces as in this embodiment will be preferable.

After the vacuum baking process, a monocrystal growing process is performed to the mixture (step 1500). The monocrystal growing process is a process for causing growth of monocrystal of CaF2 to improve the quality of the crystal, that is, to put the lattice disposition in order. The growing method may be chosen appropriately, in accordance with the size of crystal and the purpose of use, for example. The refined crystal 220 is put into a crucible 204 which is accommodated in a chamber 202 of the crystal growing furnace 200 shown in FIG. 3.

Figure 3:
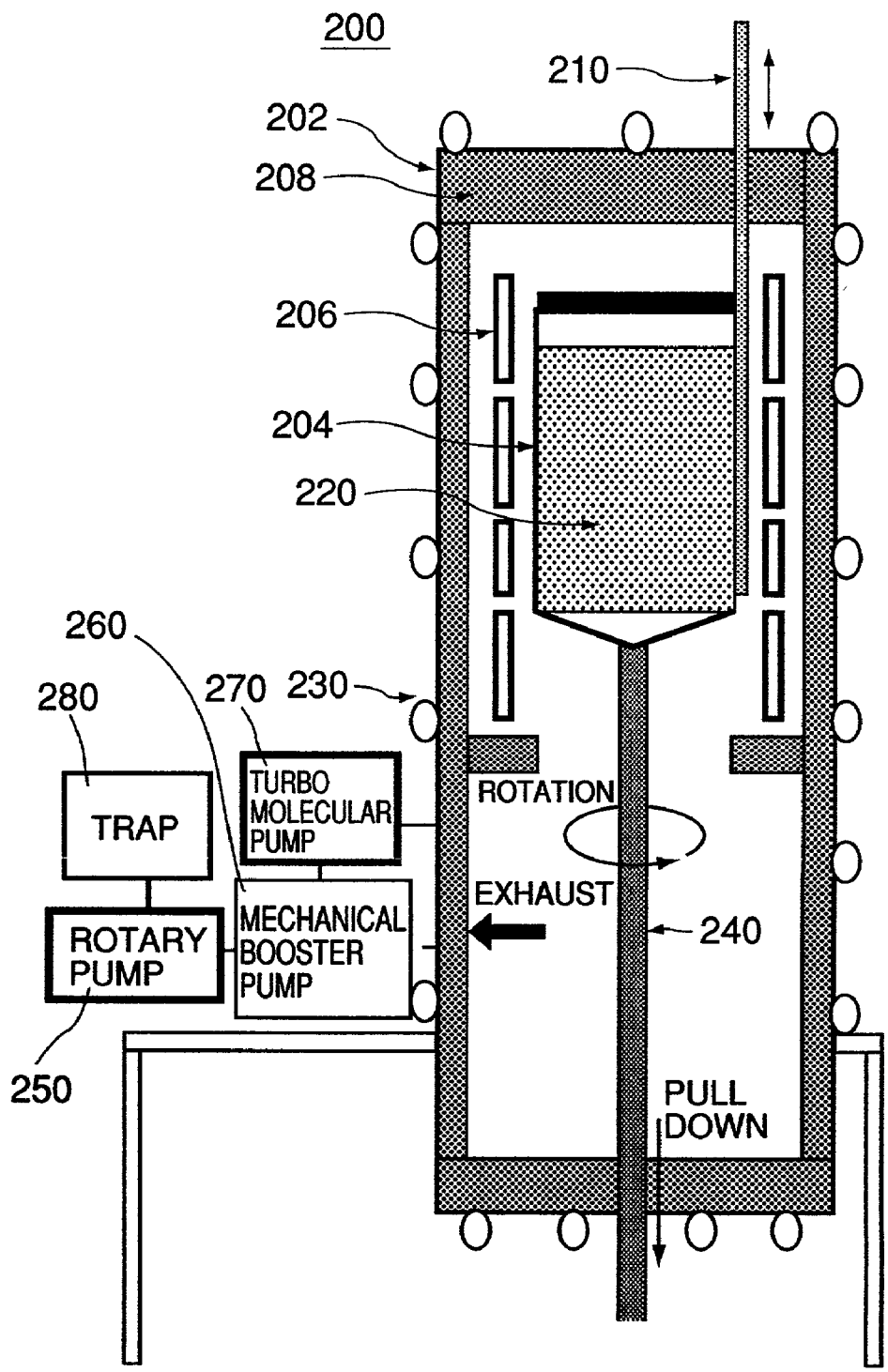
FIG. 3 is a schematic and sectional view of a crystal growing furnace to be used in a monocrystal growth process in the manufacturing method shown in FIG. 1.

In FIG. 3, denoted at 202 is a chamber for the crystal growing furnace 200. It is connected to a vacuum exhaust system which comprises a rotary pump 250, a mechanical booster pump 260, a turbo molecular pump 270, and a toxic substance arresting system 280. The chamber 202 is thermally insulated by a heat insulating material 208, and it accommodates a crucible 204 and a heater 206 therein. For example, the crucible 204 is made of carbon and has an approximately cylindrical shape, and it has a good sealing tightness. The crucible 204 is supported by a crucible supporting and pull-down mechanism 240, for rotation and for upward and downward motion. Rotation by the crucible supporting and pull-down mechanism 240 is carried out so as to make the crucible 204 temperature uniform. In this embodiment, one and the same crucible is used as the crucible 204 and the crucible 310 inside the vacuum baking furnace shown in FIG. 5. However, separate crucibles may be used (that is, the mixture inside the crucible 304 is transferred into the crucible 204). The chamber 202 is connected also to a cooling pipe 230 for temperature adjustment. Thus, by means of the heater 206 and the cooling pipe 230, a desired temperature gradient can be produced with respect to vertical direction shown in FIG. 3. Thermocouple 210 is made from platinum, for example, and it functions to measure the temperature of the crucible 204, from about the outside wall of the crucible 204. It is to be noted here that, although a scavenger is added also in the growth step (for example, not less than 0.0005 mol % and not greater than 0.05 mol %), the amount of addition can be made much less than in a case where the vacuum baking process (steps 1200 and 1400) is not included. Thus, impurities and crystal defect (particularly, transition density) contained in the crystal can be decreased.

Subsequently, the heater 206 is energized to heat the CaF2 secondary raw material (crystal) inside the crucible 204 to about 1420° C. so that the CaF2 crystal is fused completely. After that, the crucible 204 is descended gradually at a speed 2 mm/h (to pass the same through a predetermined temperature gradient), to gradually cool the fused CaF2 crystal and cause crystal growth.

Subsequently, the thus crystal-grown fluoride monocrystal is heat-treated in an annealing furnace shown in FIG. 4 (i.e., annealing process at step 1600). The annealing process is a process for thermally treat the grown CaF2 monocrystal to thereby remove any distortion which might cause crack of crystal. The grown monocrystal 420 is put into a crucible 404 which is accommodated in a chamber 402 of the annealing furnace 400 shown in FIG. 4.

Figure 4:
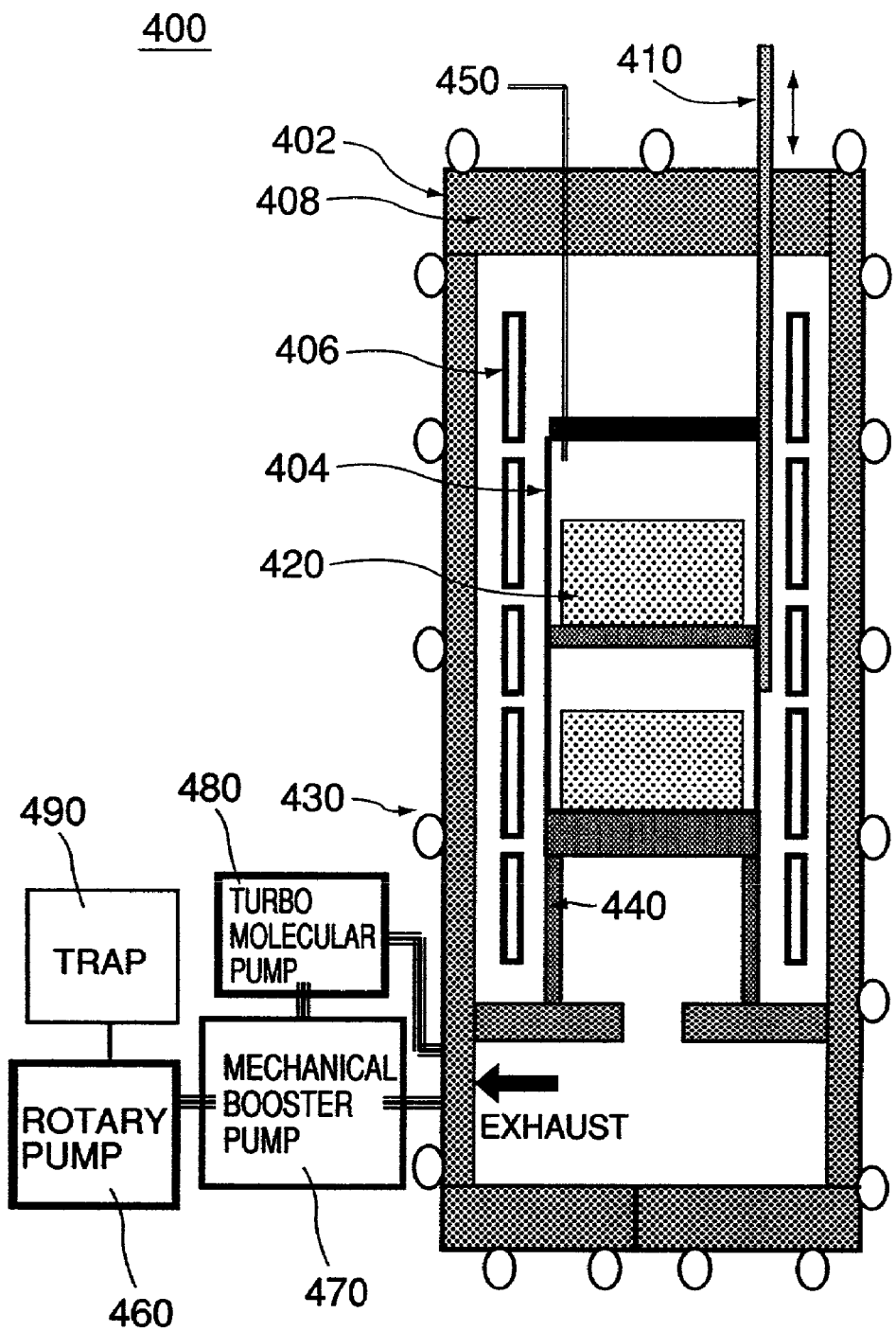
FIG. 4 is a schematic and sectional view of an annealing furnace to be used in an annealing process in the manufacturing method shown in FIG. 1.

In FIG. 4, denoted at 402 is a chamber for the annealing furnace 400. It is connected to a vacuum exhaust system which comprises a rotary pump 450, a mechanical booster pump 460, a turbo molecular pump 470, and a toxic substance arresting system 480. The chamber 402 is thermally insulated by a heat insulating material 408, and it accommodates a crucible 404 and a heater 406 therein. For example, the crucible 404 is made of carbon and has an approximately cylindrical shape, being formed with multiple stages. The crucible 404 is supported by a crucible supporting member 440. The chamber 402 is connected also to a cooling pipe 430 for temperature adjustment. Thus, by means of the heater 406 and the cooling pipe 430, the temperature of the chamber 402 can be controlled. Thermocouple 410 is made from platinum, for example, and it functions to measure the temperature of the crucible 404, from about the outside wall of the crucible 404.

In the annealing process, the crucible 404 is heated to about 900–1000° C. uniformly, to thereby remove distortion of the CaF2 crystal as it is kept in a solid state. If the heating temperature is made not less than about 1140° C., it undesirably causes a structural change, for example. The heating time is not less than about 2 hours, more preferably, about 20–30 hours. In the annealing process, due to the annealing, the crystal transition decreases. After that, while keeping the state having no distortion, the temperature of the CaF2 crystal is returned to the room temperature. Although a scavenger is added also in the annealing process, since the temperature in the annealing process is about 1000° C. and no fusion occurs, the amount of scavenger addition can be very small such as not less than 0.0005 mol % and not greater than 0.05 mol %. For example, it ma be 0.001 mol %.

In the embodiment described above, changes in bulk density before and after the growth can be made vary small as compared with those in conventional methods, such that the bulk density in the growing furnace 200 can be raised.

Also, in the embodiment described above, the vacuum baking process is performed twice, before and after the refining process. However, as a matter of course, only either one may be carried out.

The spectral transmissivity of the thus obtained CaF2 crystal is measured and, a product having high transmissivity (about 90%) with respect to a wavelength 157 nm, and having a transmissivity of not less than 70% with respect to a wavelength 130 nm is chosen. The refractive index uniformness (homogeneity) is determined on the basis of transmission wavefront and surface precision measurement made through an interferometer, and the birefringence index is measured by use of a high precision distortion gauge.

Subsequently, the CaF2 crystal is shaped into a required optical element (step s1700). The optical element may be, for example, a lens, a diffraction grating, an optical film, and a composite of them, that is, for example, one of a lens, a multiple lens, a lens array, a lenticular lens, a fly's eye lens, an aspherical lens, a diffraction grating, a binary optics element, and a composite of them. In addition to a single element of lens or the like, the optical element may be a photosensor for focus control, for example. If necessary, an antireflection film may be provided on the surface of an optical component made of fluoride crystal. As regards the antireflection film, magnesium fluoride, aluminum oxide, and tantalum oxide are suitably usable. The film can be formed by vapor deposition through resistance heating, electron beam deposition, or sputtering, for example. Since an optical element produced in accordance with the present invention has less crystal defect, the adherence of the anti-reflection film is good. In the polishing process for obtaining the shape required for the optical component (for example, convex lens, concave lens, disk-like shape, or plate-like shape) because of small transition density inside the CaF2 crystal, a decrease of local surface precision is very small, such that high-precision processing is attainable.

By combining various lenses obtainable as described above, a projection optical system or an illumination optical system suited for use with excimer lasers, particularly, ArF excimer laser and F2 excimer laser, can be provided. Further, by using an excimer laser light source, an optical system having a lens made from CaF2 crystal produced in accordance with the producing method of the present invention, and a stage for moving a substrate in combination, an exposure apparatus for photolithography can be provided. As regards the analysis method for content of lanthanum and yttrium, fluorescent X-ray analysis method, ICP emission analysis method, ICP mass analysis method and the like may be used. The analysis of oxygen and carbon was made in accordance with combustion method.

To determine the transition density, a (1,1,1) plane corresponding to a cleavage plane of a CaF2 crystal was immersed in 0.4N nitric acid solution, and the resulting etch pit density was taken as the transition density of the evaluated crystal.

A specific example of this embodiment will be described below.

To a commercially available high-purity CaF2 powder raw material of a required amount, ZnF2 as a scavenger was added by 0.1 mol % with respect to the CaF2 raw material, and they were mixed and dispersed uniformly. After that, the mixture was put into a carbon crucible. Subsequently, in a vacuum drying furnace, degasification was carried out at 150° C. and for 2 hours. Then, the material was transferred into a refining crucible, and it was heated at 1420° C. and fused, whereby toxic unwanted elements therein were removed. After that, the material was gradually cooled and solidified. The toxic unwanted portion at the surface layer of the thus obtained CaF2 block was removed, whereby a secondary raw material prior to crystal growth was obtained.

Subsequently, the above described material block was put into a monocrystal growing crucible which was vacuum dried beforehand. As a scavenger, 0.01 mol % of ZnF2 was put into the crucible. Then, the furnace was vacuum evacuated and the crucible was heated, so that a vacuum level of $8 \times 10^{-2}$ Pa and a temperature 1420° C. were attained. In order to fuse and degasify CaF2 inside the crucible, a vacuum level of $2.6 \times 10^{-4}$ Pa and a temperature 1420° C. were held for 20 hours. Subsequently, the crucible was descended at a speed 2 mm/h, and good quality CaF2 monocrystal was grown. The pull-down speed here should desirably be one corresponding to the crystal growth speed, such that, as a matter of course, it should be adjusted in accordance with the size and shape of crystal to be produced. Generally, if the size of crystal becomes large, the pull-down speed should be made slower.

Subsequently, the thus grown CaF2 monocrystal as well as ZnF2 of an addition amount 0.01 mol % with respect to the CaF2 monocrystal were put into the annealing furnace. The furnace was exhausted, and the temperature of the crucible was raised from the room temperature to 900° C. at a speed 100° C./h. After that, it was held at about 900° C. for about 50 hours. Then, it was cooled to the room temperature, at a speed 5° C./h. As regards the cooling speed here, if the crystal size is large, the cooling speed should follow it and should be slowed down. Namely, without slowing down, it becomes very difficult to make the birefringence index quite small.

The scavenger used throughout the whole procedure may be LiF, NaF, CdF2, Kr and the like, and those fluorides other than ZnF2 may be used with similar effects.

Table 1 below shows optical characteristics of CaF2 crystal obtainable in accordance with this embodiment, in comparison with conventional products.

TABLE 1

|  | PRESENT INVENTION | CONVENTIONAL PRODUCTS |
|---|---|---|
| REFRACTIVITY HOMOGENEITY TO 632.8 nm | $<1 \times 10^{-6}$ | $<3 \times 10^{-6}$ |
| BIREFRINGENCE INDEX TO 632.8 nm | <1 nm/cm | <3 nm/cm |
| INTERNAL TRANSMISSIVITY TO 157 nm | >99.8% | >99.6% |
| LASER DURABILTY TO F2 LASER WITH 3 mJ/cm² OUTPUT AND $1 \times 10^6$ PULSES | DETERIORATION <0.1% | DETERIORATION <0.3% |
| TRANSITION DENSITY IN CRYSTAL | $<1 \times 10^5/cm^2$ | $<2 \times 10^{-5}/cm^2$ |
| DISPERSION OF TRANSITION DENSITY WITHIN EFFECTIVE PORTION IN CRYSTAL | $<\pm 5 \times 10^4/cm^2$ | $<\pm 5 \times 10^4/cm^2$ |

Figure 6:
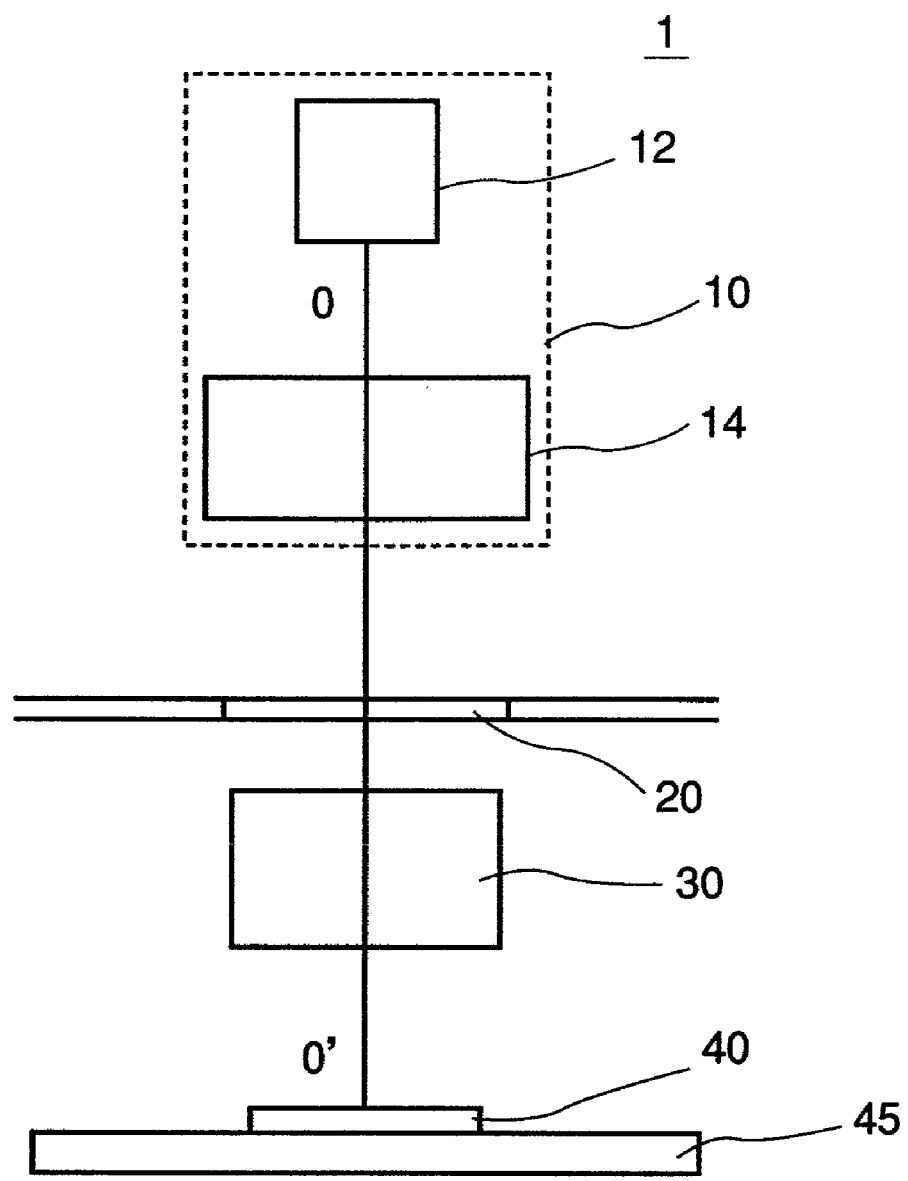
FIG. 6 is a schematic and sectional view of an exposure apparatus according to an embodiment of the present invention.

Referring now to FIG. 6, an exposure apparatus 1 according to an embodiment of the present invention will be described. Here, FIG. 6 is a schematic and sectional view of an exposure apparatus, as an example according to the present invention.

As shown in FIG. 6, the exposure apparatus 1 comprises an illumination system 10, a reticle 20, a projection optical system 30, a plate 40, and a stage 45. The exposure apparatus is a scan type projection exposure apparatus in which a circuit pattern formed on the reticle 20 is transferred to the plate 40 in accordance with a step-and-repeat method or a step-and-scan method.

The illumination system 10 serves to illuminate the reticle 20 having a transfer circuit pattern formed thereon, and it includes a light source unit 12 and an illumination optical system 14.

The light source unit 12 may comprise a laser, for example, as a light source. The laser may be ArF excimer laser having a wavelength of about 193 nm, KrF excimer laser having a wavelength of about 248 nm, or F2 excimer laser having a wavelength of about 153 nm, for example. The type of laser is not limited to an excimer laser. For example, YAG lasers may be used. Also, the number of lasers is not limited. Where a laser is used in the light source unit 12, a beam shaping optical system for transforming parallel light from the laser light source into a desired beam shape, as well as an incoherency transforming optical system for transforming coherent laser light into incoherent light, may desirably be used. However, the light source usable in the light source unit 12 is not limited to laser. One or plural lamps such as Hg lamp or xenon lamp may be used.

The illumination optical system 14 is an optical system for illuminating the mask 20. It includes a lens, a mirror, a light integrator, a stop and the like. For example, a condenser lens, a fly's eye lens, an aperture stop, a condenser lens, a slit, and an imaging optical system may be provided in this order. The illumination optical system 14 can be used with either axial light or abaxial light. The light integrator may comprise an integrator such as a fly's eye lens or combined two sets of cylindrical lens array (or lenticular lens) plates. Alternatively, it may be replaced by an optical rod or diffractive element. An optical element produced in accordance with the present invention can be used as optical elements such as lenses in this illumination optical system 14.

The reticle is made of quartz, for example, and it has formed thereon a circuit pattern (or image) to be transferred. The reticle is supported and moved by a reticle state, not shown. Diffraction light from the reticle 20 goes through the projection optical system 30, and it is projected on the plate 40. The plate 40 may be a workpiece such as a wafer or a liquid crystal substrate, and it is coated with a resist material. The reticle 20 and the plate 40 are placed in an optically conjugate relation with each other. Where the exposure apparatus is scan type projection exposure apparatus, the mask 20 and the plate 40 are scanningly moved, by which the pattern of the mask 20 is transferred to the plate 40. If the exposure apparatus is a step-and-repeat type exposure apparatus (stepper), the exposure process is performed while the mask 20 and the plate 40 are held fixed.

The projection optical system 30 may be an optical system consisting lens elements only, an optical system (catadioptric system) having lens elements and at least one concave mirror, an optical system having lens elements and at least one diffractive optical element such as kinoform, for example, or an all-mirror type optical system, for example. If correction of chromatic aberration is necessary, lens elements made of glass materials having different dispersions (Abbe's numbers), or alternatively, a diffractive optical element may be provided so as to produce dispersion in opposite direction to lens elements. An optical element produced in accordance with the present invention can be used as optical elements such as lenses in the projection optical system 30.

The plate 40 is coated with a photoresist. The photoresist coating process includes a pre-process, an adherence enhancing agent coating process, a photoresist coating process, and a pre-baking process. The pre-process includes washing, drying and the like. The adherence enhancing agent coating process is a surface improving process (i.e., hydrophobing treatment based on coating with a surface active agent) for improving the adherence between the photoresist and the ground material. In this process, an organic film such as HMDS (Hexamethyl-disilazane), for example, is applied by coating or vapor treatment. The pre-baking is a baking (firing) treatment, but it is gentle as compared with that to be done after the development. It is to remove any solvent.

The stage 45 supports the plate 40. Since any structure known in the art can be used for the stage 45, detailed description of the structure and function of it will be omitted. For example, linear motors may be used in the state 45 to move the plate 40 in X and Y directions. The reticle 20 and the plate 40 may be scanningly moved in synchronism with each other, for example. The position of the stage 45 and the position of a reticle stage (not shown) may be monitored by use of laser interferometers, for example, and these stages may be driven at a constant speed ratio. The stage 45 may be provided, for example, on a stage base which is supported by the floor, or the like, through dampers. The reticle stage and the projection optical system 40 may be provided on a barrel base (not shown) which is supported by a base frame, mounted on the floor, for example, through dampers or the like.

In the exposure process, light emitted from the light source unit 12 illuminates the reticle 20, in Koehler illumination, for example, through the illumination optical system 14. The light passing through the reticle 20 and reflecting the mask pattern is imaged on the plate 40 by the projection optical system 30. The illumination optical system 14 and the projection optical system 30 used in the exposure apparatus may include optical elements produced in accordance with the present invention, so that each can transmit ultraviolet light, deep ultraviolet light or vacuum ultraviolet light at a high transmissivity. Additionally, because of good refractive index homogeneity and small birefringence, devices such as semiconductor devices, LCD devices, image pickup devices (e.g., CCD) or thin magnetic heads, for example, can be produced at a higher resolution and a higher throughput, and economically.

Next, referring to FIGS. 7 and 8, an embodiment of a device manufacturing method which uses an exposure apparatus such as described above, will be explained.

Figure 7:
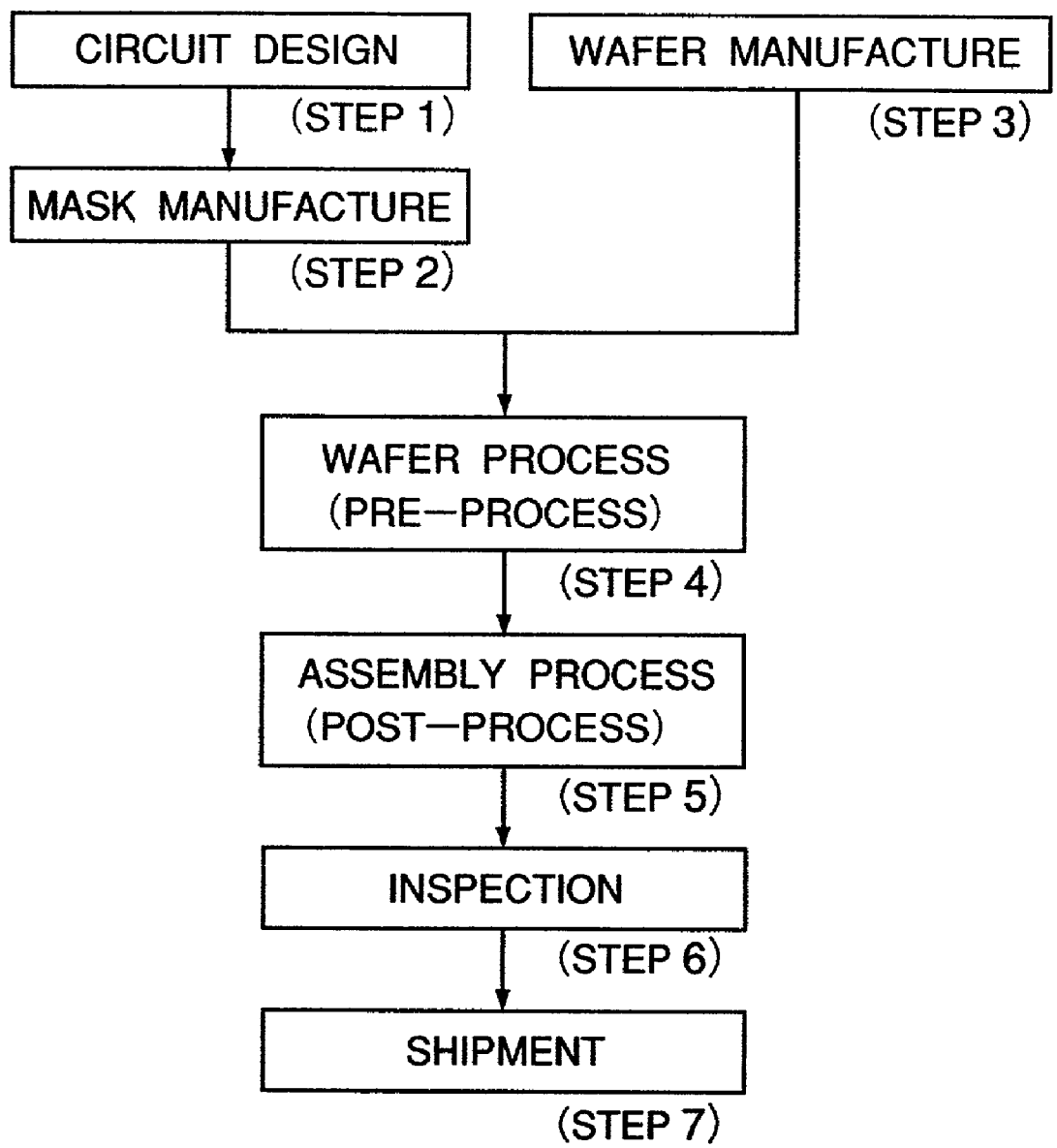
FIG. 7 is a flow chart for explaining device manufacturing processes, including an exposure process, according to an embodiment of the present invention.

FIG. 7 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 8:
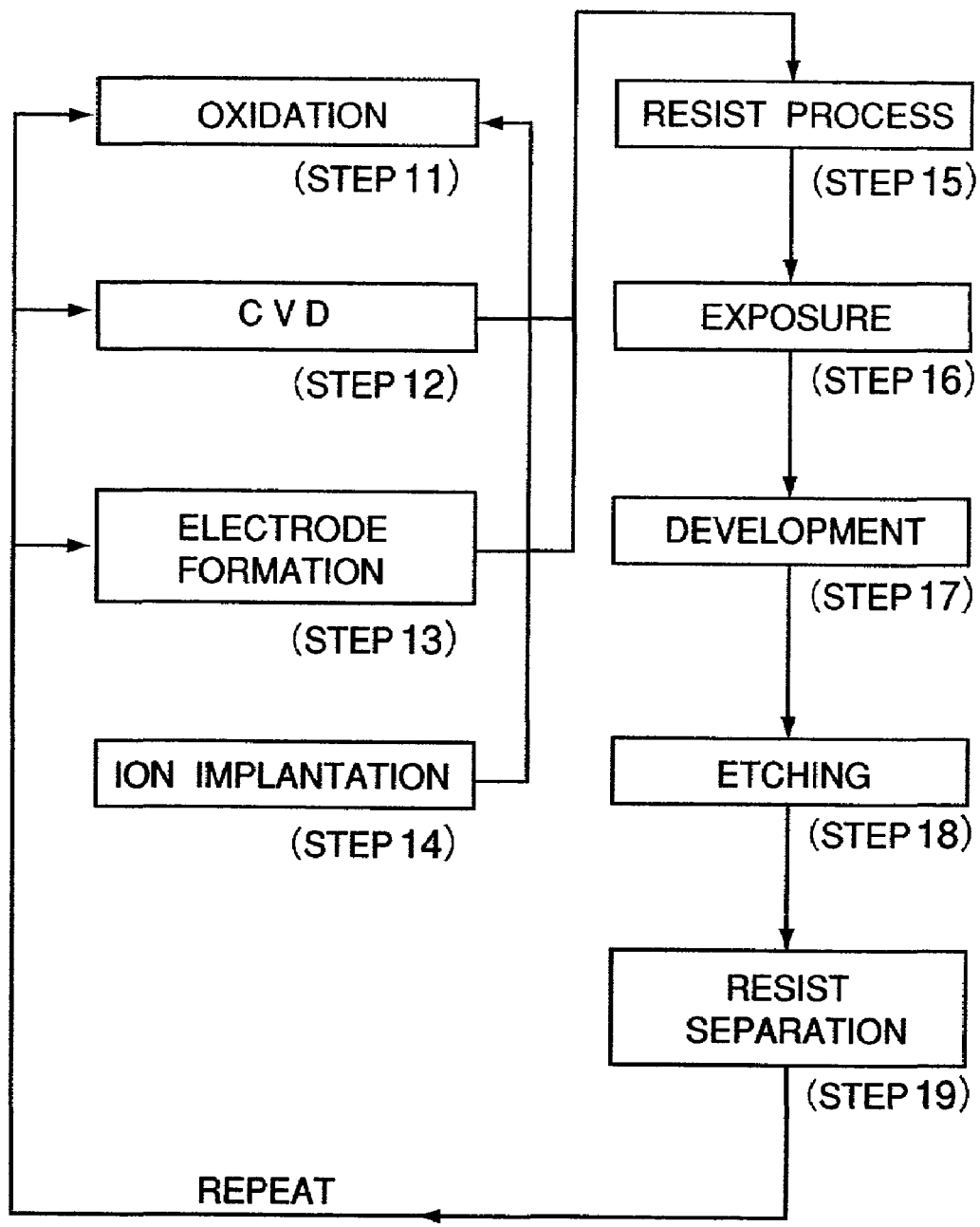
FIG. 8 is a flow chart for explaining Step 4 in the flow chart of FIG. 7, in greater detail.

FIG. 8 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is a exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high quality microdevices can be manufactured.

Although some embodiments and examples of the present invention have been described above, the present invention is not limited to the disclosed form. Various modifications are possible within the scope of the invention.

In accordance with the embodiments of the present invention as described hereinbefore, removal of moisture and other absorbed materials of the raw material and a crucible to be used, other than degasification in a refining furnace and a growing furnace, is carried out beforehand as a separate process. This effectively minimizes the amount of moisture and other absorbed substances introduced into the furnace, thereby to prevent production of crystal defect. As a result of it, the transition density inside the crystal is decreased, and thus dispersion of transition density inside the crystal is reduced. Consequently, the CaF2 crystal of the present invention can accomplish good refractive index uniformness (homogeneity) as well as small birefringence index. Further, due to decrease of moisture, oxidation prevention can be accomplished only by use of a small amount of scavenger addition. Therefore, the adverse influence of residual scavenger to the optical characteristics of the crystal is reduced considerably. The internal transmissivity and the laser durability are improved. Thus, the present invention can provide CaF2 crystal by which, even if it is irradiated with light having a short wavelength and a large power, repeatedly for a long term, the transmissivity characteristic is not deteriorated easily.

As described above, the present invention can provide a CaF2 crystal which is particularly suitably usable as an optical component for use with an excimer laser, more particularly, an optical component for excimer laser to be used in an exposure apparatus for photolithography. Also, the present invention can provide a CaF2 crystal to be used as an optical component having a good imaging performance and a good reliability.

In summary, the present invention can provide a calcium fluoride crystal having superior optical characteristics, as well as a method and apparatus for producing the same. Further, an optical element produced from such calcium fluoride can be used in an optical system of an exposure apparatus, by which an exposure process of good resolution and good throughput can be accomplished and high quality devices can be produced thereby.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing a calcium fluoride crystal, said method comprising:
   mixing a raw material of calcium fluoride and a scavenger at a predetermined proportion to obtain a first mixture;
   refining the first mixture in a crucible to remove impurities; and
   fusing the refined mixture in a crucible to cause growth of calcium fluoride crystal having a transition density in the crystal that is not greater than $1\times10^5/cm^2$, and a dispersion of transition density inside an effective portion of the crystal in a range of $\pm5\times10^4/cm^2$;

wherein said method includes a baking process before refining the first mixture or a baking process after refining the first mixture but before fusing of the refined mixture or both, wherein said baking process is carried out as a separate process from the refining process and the fusing process, by using a porous baking crucible different from the refining crucible and the fusing crucible.

2. The method of manufacturing a calcium fluoride crystal according to claim 1, wherein the first mixture contains a scavenger of 0.001 to 0.1 mol %.

3. The method of manufacturing a calcium fluoride crystal according to claim 1, wherein a scavenger of 0.0005 to 0.05 mol % is added to the fusing step.

4. The method of manufacturing a calcium fluoride crystal according to claim 1, wherein the transition density in the calcium fluoride crystal is not greater than $1\times10^5/cm^2$, and wherein dispersion of the transition density is not greater than $\pm5\times10^4/cm^2$.

5. The method of manufacturing a calcium fluoride crystal according to claim 1, wherein in said baking process, the mixture is heated in a vacuum ambience or a reduced pressure ambience.

6. The method of manufacturing a calcium fluoride crystal according to claim 1, wherein in said baking process, the mixture is heated in a gas-flow ambience in which a gas flows so as to promote removal of a substance adhered to the mixture.

* * * * *